(12) United States Patent
Lim et al.

(10) Patent No.: US 9,424,895 B2
(45) Date of Patent: Aug. 23, 2016

(54) SEMICONDUCTOR MEMORY APPARATUS AND DATA STORAGE AND POWER CONSUMPTION

(71) Applicant: SK hynix Inc., Icheon-si Gyeonggi-do (KR)

(72) Inventors: Seung Kyun Lim, Icheon-si (KR); Jung Mi Tak, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 126 days.

(21) Appl. No.: 14/244,531

(22) Filed: Apr. 3, 2014

(65) Prior Publication Data

US 2015/0117121 A1    Apr. 30, 2015

(30) Foreign Application Priority Data

Oct. 31, 2013  (KR) .................. 10-2013-0130737

(51) Int. Cl.
| | | |
|---|---|---|
| *G11C 13/00* | (2006.01) | |
| *G11C 7/10* | (2006.01) | |
| *G11C 7/08* | (2006.01) | |
| *G11C 7/22* | (2006.01) | |

(52) U.S. Cl.
CPC .............. *G11C 7/1096* (2013.01); *G11C 7/08* (2013.01); *G11C 7/22* (2013.01); *G11C 2207/2263* (2013.01)

(58) Field of Classification Search
CPC .................................................. G11C 13/0069
USPC ................................................... 365/189.011
See application file for complete search history.

(56) References Cited

U.S. PATENT DOCUMENTS

| | | | | |
|---|---|---|---|---|
| 6,327,203 B1* | 12/2001 | Won | ..................... | G11C 7/1006 365/189.07 |
| 2009/0097336 A1* | 4/2009 | Kang | ..................... | G11C 11/56 365/189.14 |
| 2010/0103723 A1* | 4/2010 | Kawai | ..................... | G11C 11/56 365/163 |
| 2011/0134713 A1* | 6/2011 | Givant | ............... | G11C 11/5642 365/210.1 |
| 2014/0233327 A1* | 8/2014 | Chen | ......................... | G11C 7/00 365/189.09 |

FOREIGN PATENT DOCUMENTS

KR    1020090120209 A    11/2009

* cited by examiner

*Primary Examiner* — Min Huang
(74) *Attorney, Agent, or Firm* — William Park & Associates Ltd.

(57) ABSTRACT

A semiconductor memory apparatus includes a write driver configured to transfer input data to a data storage region. The semiconductor memory apparatus may also include a sense amplifier configured to sense and amplify the data stored in the data storage region and output output data. Further, the semiconductor memory apparatus may also include an enable signal generation block configured to generate a write driver enable signal and a sense amplifier enable signal according to a comparison result of the input data and the output data.

18 Claims, 3 Drawing Sheets

SEMICONDUCTOR MEMORY APPARATUS AND DATA STORAGE AND POWER CONSUMPTION

CROSS-REFERENCES TO RELATED APPLICATION

The present application claims priority under 35 U.S.C. §119(a) to Korean application number 10-2013-0130737, filed on Oct. 31, 2013, in the Korean Intellectual Property Office, which is incorporated herein by reference in its entirety.

TECHNICAL FIELD

Various embodiments relate to a semiconductor integrated circuit, and more particularly, to a semiconductor memory apparatus.

BACKGROUND

A semiconductor memory apparatus is configured to receive and store data and output stored data. The semiconductor memory apparatus checks whether the received and stored data is normally stored.

SUMMARY

In an embodiment, a semiconductor memory apparatus includes: a write driver configured to transfer input data to a data storage region. The semiconductor memory apparatus may also include a sense amplifier configured to sense and amplify the data stored in the data storage region and output output data. In addition, the semiconductor memory apparatus may also include an enable signal generation block configured to generate the write driver enable signal and the sense amplifier enable signal according to a comparison result of the input data and the output data.

In an embodiment, a semiconductor memory apparatus includes: a first data input/output block configured to transfer first input data to a data storage region or sense and amplify data stored in the data storage region and output first output data. The semiconductor memory apparatus may also include a first enable signal generation block configured to determine whether the first input data and the first output data are equivalent, and determine whether to activate the first data input/output block. The semiconductor memory apparatus may also include a second data input/output block configured to transfer second input data to the data storage region or sense and amplify data stored in the data storage region and output second output data. Further, the semiconductor memory apparatus may include a second enable signal generation block configured to determine whether the second input data and the second output data are equivalent, and determine whether to activate the second data input/output block.

In an embodiment, a system comprises: a processor; a controller configured to receive a request and a data from the processor; and a memory unit configured to receive the request and the data from the controller. The memory unit includes: a write driver configured to transfer input data to a data storage region. The memory unit also includes a sense amplifier configured to sense and amplify the data stored in the data storage region and output output data. Further, the memory unit includes an enable signal generation block configured to generate the write driver enable signal and the sense amplifier enable signal according to a comparison result of the input data and the output data.

DETAILED DESCRIPTION

Hereinafter, a semiconductor memory apparatus will be described below with reference to the accompanying drawings through various embodiments. In a semiconductor memory apparatus, if the received and stored data is not normally stored, the semiconductor memory apparatus performs an operation of storing again the received data. When the power consumed to perform the operation of storing again the received data is reduced, a low power consumption semiconductor memory apparatus may be easily realized.

Figure 1:
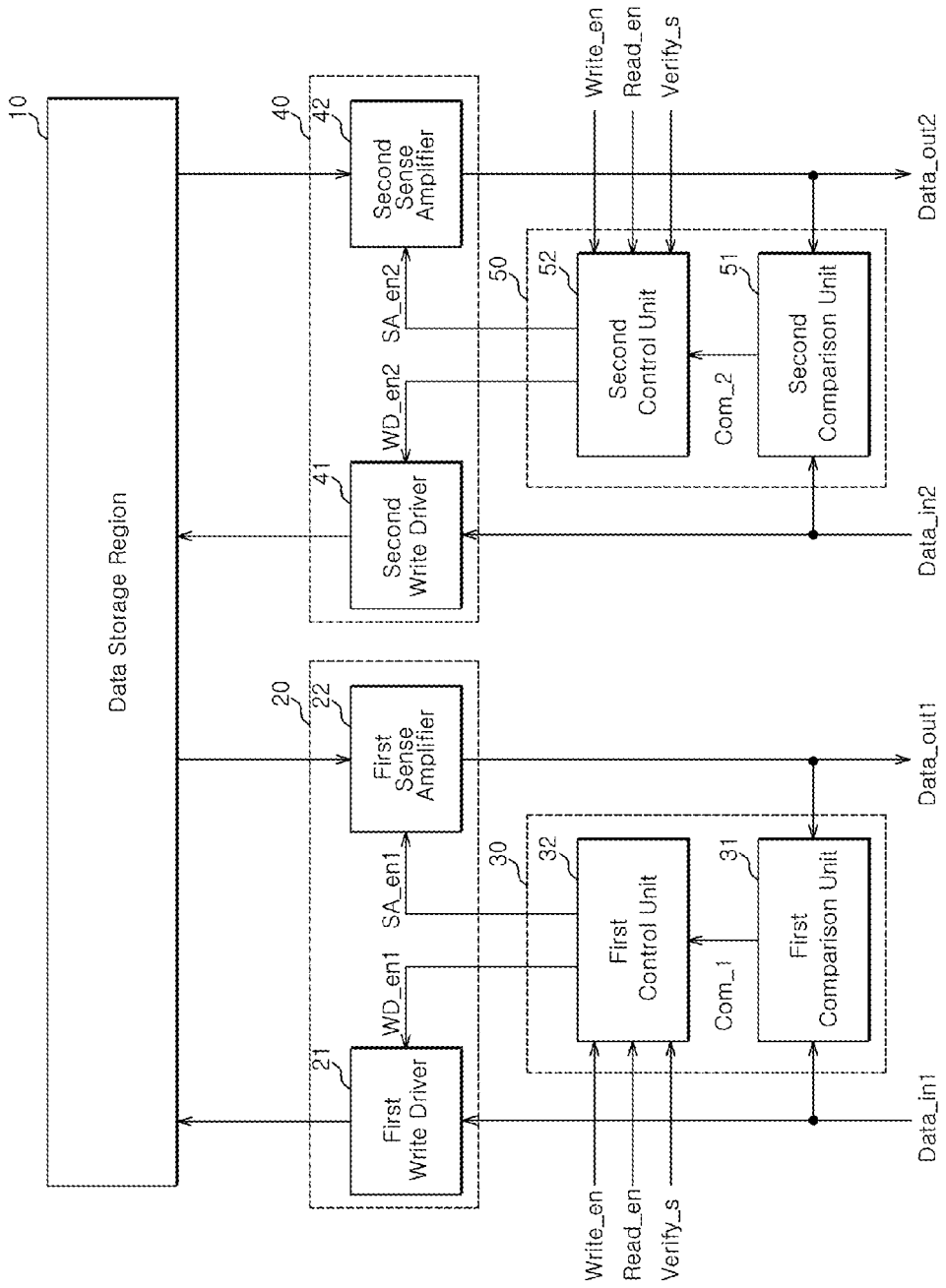
FIG. 1 is a configuration diagram of a semiconductor memory apparatus in accordance with an embodiment.

As shown in FIG. 1, a semiconductor memory apparatus in accordance with an embodiment includes a data storage region 10, a first data input/output block 20, a first enable signal generation block 30, a second data input/output block 40, and a second enable signal generation block 50.

The data storage region 10 stores data, and may be realized by a memory array which includes a plurality of memory cells (not shown). In the semiconductor memory apparatus in accordance with an embodiment, the data storage region 10 may store first input data Data_in1 and second input data Data_in2 which are transferred to the data storage region 10.

The first data input/output block 20 may transfer the first input data Data_in1 to the data storage region 10 or may sense and amplify the data stored in the data storage region 10 and output first output data Data_out1. The first output data Data_out1 is data which corresponds to the first input data Data_in1 stored in the data storage region 10.

The first data input/output block 20 includes a first write driver 21 and a first sense amplifier 22.

The first write driver 21 drives and transfers the first input data Data_in1 to the data storage region 10 in response to a first write driver enable signal WD_en1. The first write driver 21 is determined in terms of whether it is to be activated or not, in response to the first write driver enable signal WD_en1. The first write driver 21 which is activated transfers the first input data Data_in1 to the data storage region 10.

The first sense amplifier 22 is determined in terms of whether it is to be activated or not, in response to a first sense amplifier enable signal SA_en1. The first sense amplifier 22 which is activated senses and amplifies the data stored in the data storage region 10 and outputs the first output data Data_out1.

The first enable signal generation block 30 generates the first write driver enable signal WD_en1 and the first sense amplifier enable signal SA_en1 according to a result of comparing the first input data Data_in1 and the first output data Data_out1. In detail, the first enable signal generation block 30 may control whether to activate the first write driver 21; and may generate the first write driver enable signal WD_en1 and the first sense amplifier enable signal SA_en1. More specifically, the first enable signal generation block may perform the functions mentioned above in response to: a result of comparing a write enable signal Write_en, a read enable signal Read_en, a verify signal Verify_s, the first input data Data_in1 and the first output data Data_out1. The first enable signal generation block 30 may determine whether the first input data Data_in1 and the first output data Data_out1 are equivalent.

The first enable signal generation block 30 includes a first comparison unit 31 and a first control unit 32.

The first comparison unit 31 compares the first input data Data_in1 and the first output data Data_out1 and generates a first comparison signal Com_1. For example, the first comparison unit 31 disables the first comparison signal Com_1 when the first input data Data_in1 and the first output data Data_out1 are equivalent. Also, the first comparison unit 31 enables the first comparison signal Com_1 when the first input data Data_in1 and the first output data Data_out1 are different from each other.

Figure 2:
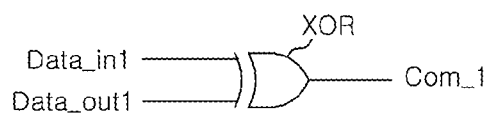
FIG. 2 is a configuration diagram of the first comparison unit shown in FIG. 1.

As shown in FIG. 2, the first comparison unit 31 includes an exclusive OR gate XOR. The exclusive OR gate XOR receives the first input data Data_in1 and the first output data Data_out1, and outputs the first comparison signal Com_1. For example, the exclusive OR gate XOR disables the first comparison signal Com_1 to a low level when the first input data Data_in1 and the first output data Data_out1 are equivalent. Also, the exclusive OR gate XOR enables the first comparison signal Com_1 to a high level when the first input data Data_in1 and the first output data Data_out1 are different from each other. The first enable signal generation block 30 may determine whether to activate the first data input/output block 20.

The first control unit 32 generates the first write driver enable signal WD_en1 and the first sense amplifier enable signal SA_en1 in response to the write enable signal Write_en, the read enable signal Read_en, the verify signal Verify_s and the first comparison signal Com_1. For example, the first control unit 32 enables the first write driver enable signal WD_en1 when the write enable signal Write_en is enabled; and enables the first sense amplifier enable signal SA_en1 when the read enable signal Read_en is enabled. Further, the first control unit 32 enables both the first write driver enable signal WD_en1 and the first sense amplifier enable signal SA_en1 when the verify signal Verify_s is enabled; and disables the first write driver enable signal WD_en1 and the first sense amplifier enable signal SA_en1 when the first comparison signal Com_1 is disabled.

Figure 3:
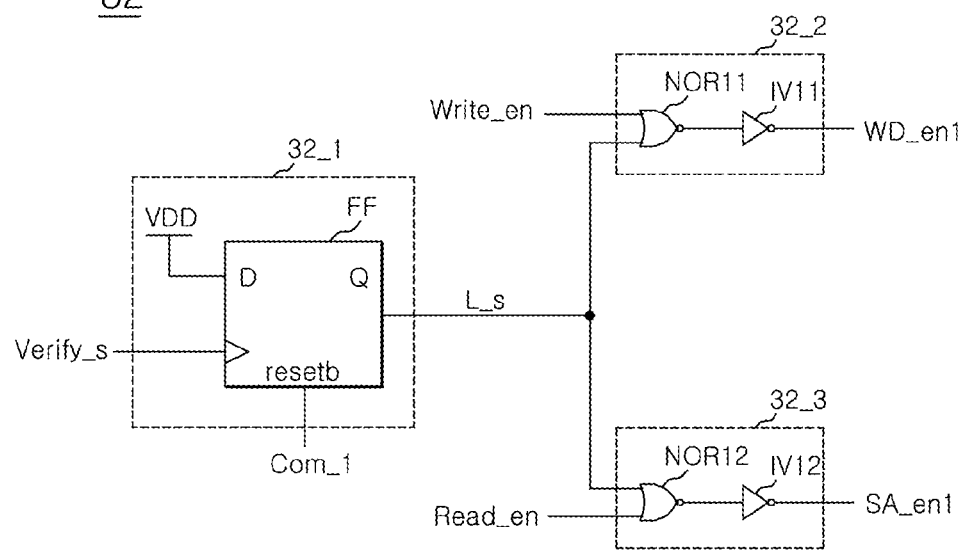
FIG. 3 is a configuration diagram of the first control unit shown in FIG. 1.

As shown in FIG. 3, the first control unit 32 includes a latch signal generating section 32_1, a write driver enable signal generating section 32_2, and a sense amplifier enable signal generating section 32_3.

The latch signal generating section 32_1 enables a latch signal L_s to a high level when the verify signal Verify_s is enabled in the state in which the first comparison signal Com_1 is enabled. The latch signal generating section 32_1 disables the latch signal L_s to a low level when the first comparison signal Com_1 is disabled. That is to say, the latch signal generating section 32_1 initializes the latch signal L_s to the low level when the first comparison signal Com_1 is disabled to the low level.

The latch signal generating section 32_1 includes a flip-flop FF. The flip-flop FF receives the first comparison signal Com_1 through a reset terminal resetb thereof. Therefore, the flip-flop FF disables, that is, initializes, the latch signal L_s to the low level regardless of the verify signal Verify_s when the first comparison signal Com_1 is disabled to the low level. Further, the flip-flop FF outputs an external voltage VDD as the voltage level of the latch signal L_s when the verify signal Verify_s is enabled to a high level in the state in which the first comparison signal Com_1 is enabled to the high level. In other words, the flip-flop FF enables the latch signal L_s to the high level when the verify signal Verify_s is enabled to the high level in the state in which the first comparison signal Com_1 is enabled to the high level. The latch signal generation section 32_1 may also retain the enabled latch signal L_s until the first comparison signal Com_1 is disabled.

The write driver enable signal generating section 32_2 enables the first write driver enable signal WD_en1 to a high level when even one signal of the write enable signal Write_en and the latch signal L_s is enabled to a high level. The write driver enable signal generation section 32_2 may enable the write driver enable signal WD_en1 when the write enable signal Write_en or the latch signal L_s is enabled.

The write driver enable signal generating section 32_2 includes a first NOR gate NOR11 and a first inverter IV11. The first NOR gate NOR11 receives the write enable signal Write_en and the latch signal L_s. The first inverter IV11 receives the output signal of the first NOR gate NOR11 and outputs the first write driver enable signal WD_en1.

The sense amplifier enable signal generating section 32_3 enables the first sense amplifier enable signal SA_en1 to a high level when even one signal of the read enable signal Read_en and the latch signal L_s is enabled to a high level. The sense amplifier enable signal generation section 32_3 may enable the sense amplifier enable signal SA_en1 when the read enable signal Read_en or the latch signal L_s is enabled.

The sense amplifier enable signal generating section 32_3 includes a second NOR gate NOR12 and a second inverter IV12. The second NOR gate NOR12 receives the read enable signal Read_en and the latch signal L_s. The second inverter IV12 receives the output signal of the second NOR gate NOR12 and outputs the first sense amplifier enable signal SA_en1.

The second data input/output block 40 may transfer the second input data Data_in2 to the data storage region 10 or may sense and amplify the data stored in the data storage region 10 and output second output data Data_out2. The second output data Data_out2 is data which corresponds to the second input data Data_in2 stored in the data storage region 10.

The second data input/output block 40 includes a second write driver 41 and a second sense amplifier 42.

The second write driver 41 drives and transfers the second input data Data_in2 to the data storage region 10 in response to a second write driver enable signal WD_en2. The second write driver 41 is determined in terms of whether it is to be activated or not, in response to the second write driver enable signal WD_en2. The second write driver 41 which is activated transfers the second input data Data_in2 to the data storage region 10.

The second sense amplifier 42 is determined in terms of whether it is to be activated or not, in response to a second sense amplifier enable signal SA_en2. The second sense amplifier 42 which is activated senses and amplifies the data stored in the data storage region 10 and outputs the second output data Data_out2.

The second enable signal generation block 50 generates the second write driver enable signal WD_en2 and the second sense amplifier enable signal SA_en2 according to a result of comparing the second input data Data_in2 and the second output data Data_out2. In detail, the second enable signal generation block 50 may control whether to activate the second write driver 41 and may generate the second write driver enable signal WD_en2 and the second sense amplifier enable signal SA_en2. More specifically, the second enable signal generation block 50 may perform the functions described above in response to: a result of comparing the write enable signal Write_en, the read enable signal Read_en, the verify signal Verify_s, the second input data Data_in2 and the second output data Data_out2. The second enable signal generation block 50 may determine wither the second input data Data_in2 and the second output data Data_out2 are equivalent.

The second enable signal generation block 50 includes a second comparison unit 51 and a second control unit 52.

The second comparison unit 51 compares the second input data Data_in2 and the second output data Data_out2 and generates a second comparison signal Com_2. For example, the second comparison unit 51 disables the second comparison signal Com_2 when the second input data Data_in2 and the second output data Data_out2 are equivalent. Also, the second comparison unit 51 enables the second comparison signal Com_2 when the second input data Data_in2 and the second output data Data_out2 are different from each other.

The second comparison unit 51 is constituted by an exclusive OR gate, in the same manner as the first comparison unit 31.

The second control unit 52 generates the second write driver enable signal WD_en2 and the second sense amplifier enable signal SA_en2 in response to the write enable signal Write_en, the read enable signal Read_en, the verify signal Verify_s and the second comparison signal Com_2. For example, the second control unit 52 enables the second write driver enable signal WD_en2 when the write enable signal Write_en is enabled; and enables the second sense amplifier enable signal SA_en2 when the read enable signal Read_en enabled. Further, the second control unit 52 enables both the second write driver enable signal WD_en2 and the second sense amplifier enable signal SA_en2 when the verify signal Verify_s is enabled; and disables the second write driver enable signal WD_en2 and the second sense amplifier enable signal SA_en2 when the second comparison signal Com_2 is disabled. The second enable signal generation block 50 may determine whether to activate the second data input/output block 40.

The second control unit 52 is configured in the same manner as the first control unit 32 with the exception that input signals and output signals are different.

The semiconductor memory apparatus in accordance with an embodiment, configured as mentioned above, operates as follows.

The first and second write drivers 21 and 41 transfer the first input data Data_in1 and the second input data Data_in2 to the data storage region 10 when the write enable signal Write_en is enabled.

The data storage region 10 stores the first input data Data_in1 and the second input data Data_in2 which are received from the first and second write drivers 21 and 41.

The first and second sense amplifiers 22 and 42 sense and amplify the data stored in the data storage region 10 and output the first and second output data Data_out1 and Data_out2 when the read enable signal Read_en is enabled.

In a verify operation after a write operation, the semiconductor memory apparatus determines whether inputted data are normally stored or not, by enabling the verify signal Verify_s; and performs an operation of storing again the inputted data for data which is not normally stored.

For example, it is assumed that the first and second input data Data_in1 and Data_in2 are stored in the data storage region 10 after the write operation, that is, as the write enable signal Write_en is enabled.

Thereafter, the verify signal Verify_s is enabled.

If the verify signal Verify_s is enabled, all the first and second write driver enable signals WD_en1 and WD_en2 and the first and second sense amplifier enable signals SA_en1 and SA_en2 are enabled.

If the first sense amplifier enable signal SA_en1 is enabled, the first sense amplifier 22 senses and amplifies the first input data Data_in1 which is stored in the data storage region 10 and outputs the first output data Data_out1.

If the second sense amplifier enable signal SA_en2 is enabled, the second sense amplifier 42 senses and amplifies the second input data Data_in2 which is stored in the data storage region 10 and outputs the second output data Data_out2.

The first comparison unit 31 enables the first comparison signal Com_1 when the first input data Data_in1 and the first output data Data_out1 are different from each other. The first comparison unit 31 disables the first comparison signal Com_1 when the first input data Data_in1 and the first output data Data_out1 are equivalent.

The second comparison unit 51 enables the second comparison signal Com_2 when the second input data Data_in2 and the second output data Data_out2 are different from each other. The second comparison unit 51 disables the second comparison signal Com_2 when the second input data Data_in2 and the second output data Data_out2 are equivalent.

The first and second control units 32 and 52 retain the enabled states of the first and second write driver enable signals WD_en1 and WD_en2 and the first and second sense amplifier enable signals SA_en1 and SA_en2 until the first and second comparison signals Com_1 and Com_2 are disabled, when the verify signal Verify_s is enabled.

Therefore, the first enable signal generation block 30 including the first comparison unit 31 and the first control unit 32 enables the first write driver enable signal WD_en1 and the first sense amplifier enable signal SA_en1 until the first comparison signal Com_1 is disabled, when the verify signal Verify_s is enabled.

Hence, the first write driver 21 and the first sense amplifier 22 are activated until the first input data Data_in1 and the first output data Data_out1 become equivalent. The activated first write driver 21 transfers the first input data Data_in1 to the data storage region 10 until it is deactivated; and the activated first sense amplifier 22 senses and amplifies the data stored in the data storage region 10 and outputs the first output data Data_out1 until it is deactivated.

The second enable signal generation block 50 including the second comparison unit 51 and the second control unit 52 enables the second write driver enable signal WD_en2 and the second sense amplifier enable signal SA_en2 until the second comparison signal Com_2 is disabled, when the verify signal Verify_s is enabled.

Hence, the second write driver 41 and the second sense amplifier 42 are activated until the second input data Data_in2 and the second output data Data_out2 become equivalent. The activated second write driver 41 transfers the second input data Data_in2 to the data storage region 10 until it is deactivated; and the activated second sense amplifier 42 senses and amplifies the data stored in the data storage region 10 and outputs the second output data Data_out2 until it is deactivated.

In this way, in the verify operation where an operation in which a plurality of data are simultaneously inputted and outputted is repeated, the semiconductor memory apparatus in accordance with an embodiment determines whether the respective data are normally stored and ends the verify operation for data which is normally stored. The ending of the verify operation means that a comparison signal is disabled, that is, input data and output data are determined to be equivalent. For example, in FIG. 1, if verification for whether the first input data Data_in1 and the first output data Data_out1 are equivalent is completed earlier than verification for whether the second input data Data_in2 and the second output data Data_out2 are equivalent, the first write driver 21 and the first sense amplifier 22 are deactivated earlier than the second write driver 41 and the second sense amplifier 42. Therefore, since the semiconductor memory apparatus in accordance with an embodiment deactivates a write driver and a sense amplifier only for data for which a verify operation is completed, among a plurality of data, an advantage is provided in reducing the power consumption of the semiconductor memory apparatus.

Figure 4:
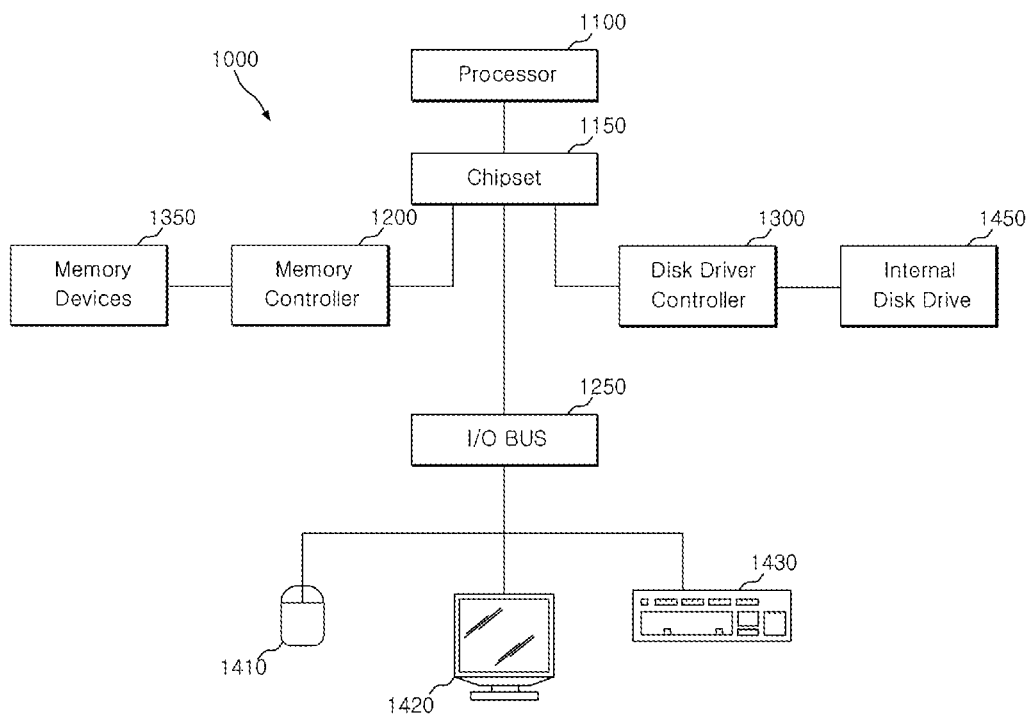
FIG. 4 illustrates a block diagram of a system employing a memory controller circuit in accordance with an embodiment.

Referring to FIG. 4 a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may correspond to the semiconductor memory apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drive 1450 may communicate with each other or with the chipset 1150 using virtually any type of communication protocol.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    a write driver configured to receive input data, transfer and store the input data to a data storage region;
    a sense amplifier configured to sense and amplify the input data stored in the data storage region and output the data sensed and amplified as output data; and
    an enable signal generation block configured to enable a write driver enable signal according to a comparison result of the input data and the output data when a write enable signal is enabled, enable a sense amplifier enable signal according to the comparison result when a read enable signal is enabled and enable both the write driver enable signal and the sense amplifier enable signal according to the comparison result when a verify signal is enabled.

2. The semiconductor memory apparatus according to claim 1, wherein the enable signal generation block comprises:
    a comparison unit configured to compare the input data and the output data and generate a comparison signal; and
    a control unit configured to generate the write driver enable signal and the sense amplifier enable signal in response to the write enable signal, the read enable signal, the verify signal and the comparison signal.

3. The semiconductor memory apparatus according to claim 2, wherein the control unit comprises:
    a latch signal generating section configured to generate a latch signal in response to the verify signal and the comparison signal;
    a write driver enable signal generating section configured to generate the write driver enable signal in response to the latch signal and the write enable signal; and
    a sense amplifier enable signal generating section configured to generate the sense amplifier enable signal in response to the latch signal and the read enable signal.

4. The semiconductor memory apparatus according to claim 3, wherein the write driver enable signal generating section enables the write driver enable signal when the write enable signal or the latch signal is enabled.

5. The semiconductor memory apparatus according to claim 3, wherein the sense amplifier enable signal generating section enables the sense amplifier enable signal when the read enable signal or the latch signal is enabled.

6. The semiconductor memory apparatus according to claim 3, wherein the latch signal generating section enables the latch signal when the verify signal is enabled, and retains the enabled latch signal until the comparison signal is disabled.

7. The semiconductor memory apparatus according to claim 6, wherein the latch signal generating section disables the latch signal when the comparison signal is disabled.

8. A semiconductor memory apparatus comprising:
    a first data input/output block configured to receive first input data for transferring the first input data to a data storage region or output first output data by sensing and amplifying data stored in the data storage region;
    a first enable signal generation block configured to determine whether the first input data and the first output data are equivalent, and determine whether to activate the first data input/output block;
    a second data input/output block configured to receive second input data for transferring the second input data to the data storage region or output second output data by sensing and amplifying data stored in the data storage region; and
    a second enable signal generation block configured to determine whether the second input data and the second output data are equivalent, and determine whether to activate the second data input/output block,
    wherein the first enable signal generation block controls whether to activate the write driver which transfers the first input data and the sense amplifier which outputs the first output data, in response to a write enable signal, a read enable signal, a verify signal and whether or not the first input data and the first output date are equivalent, and wherein the second enable signal generation block controls whether to activate the write driver which transfers the second input data or the sense amplifier which outputs the second output data, in response to the write enable signal, the read enable signal, the verify signal and whether or not the second input data and the second output date are equivalent.

9. The semiconductor memory apparatus according to claim 8, wherein the first output data is data which corresponds to the first input data stored in the data storage region, and the second output data is data which corresponds to the second input data stored in the data storage region.

10. The semiconductor memory apparatus according to claim 9, wherein the first and second data input/output blocks comprise:

write drivers configured to drive and transfer the respective first and second input data to the data storage region; and sense amplifiers configured to sense and amplify respective data stored in the data storage region and output the first and second output data.

11. The semiconductor memory apparatus according to claim 8, wherein the write driver which transfers the first input data is determined in terms of whether it is to be activated or not, in response to a first write driver enable signal, wherein the sense amplifier which outputs the first output data is determined in terms of whether it is to be activated or not, in response to a first sense amplifier enable signal, wherein the write driver which transfers the second input data is determined in terms of whether it is to be activated or not, in response to a second write driver enable signal, and wherein the sense amplifier which outputs the second output data is determined in terms of whether it is to be activated or not, in response to a second sense amplifier enable signal.

12. The semiconductor memory apparatus according to claim 11, wherein the first enable signal generation block enables the first write driver enable signal when the write enable signal is enabled or the first input data and the first output data are not equivalent, and wherein the first enable signal generation block enables the first sense amplifier enable signal when the read enable signal is enabled or the first input data and the first output data are not equivalent in a state in which the verify signal is enabled.

13. The semiconductor memory apparatus according to claim 11, wherein the second enable signal generation block enables the second write driver enable signal when the write enable signal is enabled or the second input data and the second output data are not equivalent, and wherein the second enable signal generation block enables the second sense amplifier enable signal when the read enable signal is enabled or the second input data and the second output data are not equivalent in a state in which the verify signal is enabled.

14. The semiconductor memory apparatus according to claim 11, wherein the first enable signal generation block generates the first write driver enable signal and the first sense amplifier enable signal in response to a comparison of the first input data and the first output data.

15. The semiconductor memory apparatus according to claim 14, wherein the second enable signal generation block generates the second write driver enable signal and the second sense amplifier enable signal in response to a comparison of the second input data and the second output data.

16. The semiconductor memory apparatus according to claim 14, wherein the first enable signal generation block comprises:

a first comparison unit configured to disable a first comparison signal when the first input data and the first output data are equivalent, and enable the first comparison signal when the first input data and the first output data are different.

17. The semiconductor memory apparatus according to claim 15, wherein the second enable signal generation block comprises:

a second comparison unit configured to disable a second comparison signal when the second input data and the second output data are equivalent, and enable the second comparison signal when the second input data and the second output data are different.

18. The semiconductor memory apparatus according to claim 16, further comprising:

a control unit configured to enable the first writer driver enable signal and the first sense amplifier enable signal in response to a verify signal, and disable the first writer driver enable signal and the first sense amplifier enable signal when the first comparison signal is disabled.

* * * * *